(12) United States Patent
Aberle et al.

(10) Patent No.: US 7,340,437 B2
(45) Date of Patent: Mar. 4, 2008

(54) CIRCUIT CONFIGURATION AND METHOD FOR IDENTIFYING ERROR SITUATIONS IN INTERCONNECTED SYSTEMS

(75) Inventors: Markus Aberle, Dettingen (DE); Klaus Beutelschiess, Dettingen (DE)

(73) Assignee: NuCellSys GmbH, Kirchheim-Nabern (DE)

( * ) Notice: Subject to any disclaimer, the term of this patent is extended or adjusted under 35 U.S.C. 154(b) by 0 days.

(21) Appl. No.: 10/528,751

(22) PCT Filed: Sep. 24, 2003

(86) PCT No.: PCT/EP03/10641

§ 371 (c)(1),
(2), (4) Date: Mar. 20, 2006

(87) PCT Pub. No.: WO2004/031786

PCT Pub. Date: Apr. 15, 2004

(65) Prior Publication Data

US 2006/0206762 A1 Sep. 14, 2006

(30) Foreign Application Priority Data

Sep. 25, 2002 (DE) .............................. 102 44 534

(51) Int. Cl.
*G06F 19/00* (2006.01)
*G06F 17/40* (2006.01)

(52) U.S. Cl. .................. 705/58; 324/500; 324/509; 324/600; 702/57; 702/64

(58) Field of Classification Search ............ 324/76.11, 324/500, 509, 510, 811, 600, 511; 702/57, 702/58, 59, 64
See application file for complete search history.

(56) References Cited

U.S. PATENT DOCUMENTS

| 3,808,534 A | * | 4/1974 | Summers et al. ........... 340/517 |
| 5,063,516 A | * | 11/1991 | Jamoua et al. ............... 701/114 |
| 5,909,348 A | * | 6/1999 | Zydek et al. ................. 361/79 |
| 6,056,384 A | * | 5/2000 | Sato et al. ................... 318/439 |

FOREIGN PATENT DOCUMENTS

| DE | 198 13 964 A1 | * | 8/1999 |
| EP | 1 100 100 A1 | * | 5/2001 |
| FR | 2 758 626 A1 | * | 7/1998 |
| WO | WO 96/38736 A1 | * | 12/1996 |

* cited by examiner

*Primary Examiner*—Edward R Cosimano
(74) *Attorney, Agent, or Firm*—Crowell & Moring LLP

(57) ABSTRACT

The circuit configuration according to the invention comprises an electrical signal line loop, several partial systems connected thereto, which evaluate the state of the signal line loop, wherein a first selectable switching means is looped in between a first end of the signal line loop and a first voltage connection and a second selectable switching means is looped in between a second end of the signal line loop and a second voltage connection, and a selection unit for selecting the first and second switching means. Use, e.g. in a fuel cell system.

16 Claims, 2 Drawing Sheets

CIRCUIT CONFIGURATION AND METHOD FOR IDENTIFYING ERROR SITUATIONS IN INTERCONNECTED SYSTEMS

FIELD OF THE INVENTION

The invention relates to a circuit configuration and an associated method for identifying error situations in interconnected systems.

BACKGROUND OF THE INVENTION

With devices or overall systems consisting of several interconnected partial systems the functions of the partial systems may be mutually dependent. If, for example, one partial system fails, it may become necessary to switch off the other partial systems or to restrict their range of functions.

If a partial system generates a voltage, for example, the voltage generation may presuppose the presence of an electrical consumer. The presence of an electrical consumer can be determined by detecting the occupancy state of a plug-in connector, into which the electrical consumer is plugged. If a connector is detected in the plug-in connection, the partial system may generate the voltage. If there is no connector in the plug-in connector, voltage may not be generated. The following partial systems dependent on this partial system are thereby possibly likewise restricted in their permitted range of functions.

Interconnection of the partial systems in the device can take place, for example, in that the voltage supply of the partial system following in each case is made available by the partial system preceding in each case. If an error or a critical functional state is identified in the preceding partial system, the voltage supply of the following partial system and thus of all following partial systems is switched off. This ensures that if an error state occurs the following partial systems are switched off and do not execute functions which may lead, for example, to destruction or damage of partial systems or the overall system.

Interconnection of the partial systems in this case takes place hard-wired via the respective voltage supplies of the partial systems. The number of partial systems must be taken into account in designing the circuit.

SUMMARY OF THE INVENTION

The invention is based as a technical problem on providing a circuit configuration and a method with which mutually dependent partial systems can be interconnected flexibly and economically, so that if any error situations occur in or on the partial systems safe operation of the overall system can be ensured.

The invention solves this problem by providing a circuit configuration with the features of the claimed apparatus and a method with the features of the claimed process.

The circuit configuration according to the invention comprises an electrical signal line loop, several partial systems connected thereto, which evaluate the state of the signal line loop, wherein a first selectable switching means is looped in between a first end of the signal line loop and a first voltage connection and a second selectable switching means is looped in between a second end of the signal line loop and a second voltage connection, and a selection unit for selecting the first and second switching means.

Physical interconnection of the partial systems takes place with the aid of the signal line loop, wherein in particular the partial systems themselves and external events, for example plugging or unplugging a plug-in connector, can influence the state of the signal line loop.

With the aid of the circuit configuration according to the invention, the partial systems connected to the signal line loop are capable of detecting interruptions and short-circuits of the signal line loop by evaluation of the state of the signal line loop.

The selection unit controls the first and the second switching means in such a way that alternately either the first switching means is through-connected or conductive or the second switching means is through-connected or conductive. If one switching means is through-connected, the other switching means in each case locks or is non-conductive. The selection signal generated by the selection unit can be, for example, a periodic square-wave signal with a fixed pulse duty factor.

In a further development of the invention, a first impedance is switched parallel to the first switching means and a second impedance is switched parallel to the second switching means.

The function will be explained briefly below using an example. If, for example, the second voltage applied to the second voltage connection is the ground voltage or the ground potential and the first voltage applied to the first voltage connection is greater than the second voltage, if the first switching means is conductive, a current can flow out of the first voltage connection, through the first switching means—the current flow parallel to this through the first impedance is negligible if the first impedance is suitably dimensioned—via the signal line loop, through the second impedance and then to earth. With proper functioning the partial systems measure approximately one voltage level resulting from the voltage level of the first voltage minus a forward voltage of the first switching means.

If the switching means are then selected by the selection unit in such a way that the first switching means locks and the second switching means is conductive, a current flows out of the first voltage connection, through the first impedance, via the signal line loop, via the second switching means—the current flow parallel to this through the second impedance is negligible—and then to earth. With proper functioning the partial systems measure approximately one voltage level, resulting from a forward voltage of the second switching means.

With proper functioning, i.e. without an interruption or a short-circuit of the signal line loop and assuming that the forward voltage of the switching means can be ignored, the partial systems on the signal line loop measure a voltage curve which alternates between the first voltage and the ground voltage.

If the signal line loop is interrupted at one point, for example because a connector of an electrical consumer is not plugged in, the partial systems on the section of the signal line loop facing the first voltage connection continuously measure the first voltage and the partial systems on the section of the signal line loop facing the second voltage connection continuously measure the second voltage, i.e. the ground voltage.

If the signal line loop is short-circuited with the first or the second voltage connection, all the partial systems continuously measure the first or the second voltage. This makes detection of a corresponding short-circuit possible.

In a further development of the invention, the first voltage connection is a supply voltage connection for the partial systems. This simplifies the circuit configuration and the circuit design, as no further voltages have to be provided, for example with the aid of separate voltage regulators.

In a further development of the invention, the second voltage connection is the ground connection. This likewise simplifies the circuit configuration and the circuit design, as the ground voltage or the ground potential is available to all partial systems as general reference voltage or reference potential.

In a further development of the invention, the first or second switching means is a transistor. Transistors, for example bipolar transistors or MOS transistors, have good switching properties, are available and cheap to acquire.

In a further development of the invention, the first and the second transistor are transistors complementary to one another. Examples of complementary transistors are bipolar npn-type or pnp-type transistors or n-type or p-type MOS transistors. Because the transistors are complementary to one another, a complementary switching pattern can be achieved with the aid of a common selection signal, i.e. only one of the two transistors is conductive in each case.

In a further development of the invention, the first and second impedance are ohmic resistors. Ohmic resistors are cheap and dimensioning of the circuit configuration is simple to perform.

In a further development of the invention, the partial systems are connected to the signal line loop with high resistivity. This enables any number of partial systems to be connected to the signal line loop. Dimensioning depending on the number is not necessary.

In a further development of the invention, the signal line loop is looped through the partial systems. Each partial system can influence the state of the signal line loop, for example interrupt the signal line loop, depending on its internal operating state.

In a further development of the invention, the partial systems have means for interrupting the signal line loop depending on their functional state. If, for example, an internal error occurs in a partial system, the corresponding partial system may cause an internal interruption of the signal line loop. This interruption can be detected by all the other partial systems and may lead to triggering of appropriate error recovery.

The method for identifying error situations of an electrical signal line loop with several partial systems connected thereto, in particular partial systems for voltage generation in a fuel cell system, comprises the steps: charging a first end of the signal line loop with a first voltage of a first voltage connection and connecting a second end of the signal line loop to a second voltage connection via a second impedance, alternating with this, connecting the first end to the first voltage connection via a first impedance and charging the second end with the second voltage of the second voltage connection, and measuring and evaluating the signal course on the signal line loop to identify the error situation. The error situations comprise one or more interruptions of the signal line loop and short-circuits of the signal line loop against a voltage. In the method according to the invention the ends of the signal line loop are alternately charged with different voltages. In the case of error-free operation this gives rise to an alternating voltage signal which is evaluated by the partial systems connected to the signal line loop.

In a further development of the method, during evaluation of the signal course is detected which partial systems constantly measure the first voltage, which partial systems measure an undefined voltage and which partial systems constantly measure the second voltage and short-circuits or short-circuits to ground and/or interruptions of the signal line loop are ascertained and/or located as a function of the voltages measured by the individual partial systems.

In a further development of the method, during evaluation of the signal course an error is identified if at least one partial system measures a DC voltage. Without an interruption or short-circuit of the signal line loop the voltage of the signal line loop alternates between two voltage levels. If a DC voltage is measured, consequently there must be an error present in the form of an interruption or a short-circuit.

In a further development of the method, during evaluation of the signal course a short-circuit of the signal line loop with the first voltage connection is identified if all the partial systems measure a DC voltage with the level of the first voltage. If the signal line loop is short-circuited with the first voltage connection, the first voltage is continuously applied to the signal line loop. This can consequently be drawn on as a criterion for a short-circuit of the signal line loop with the first voltage connection. Any overload currents caused by the short-circuit which occasion a response from safety devices or failure of the overall system are not taken into account in this.

In a further development of the method, during evaluation of the signal course a short-circuit of the signal line loop with the second voltage connection is identified if all the partial systems measure a DC voltage with the level of the second voltage. If the signal line loop is short-circuited with the second voltage connection the second voltage is continuously applied to the signal line loop.

In a further development of the method, during evaluation of the signal course an interruption at a location on the signal line loop is identified if partial systems on one side of the location constantly measure the first voltage and partial systems on the other side of the location constantly measure the second voltage. If there is an interruption of the signal line loop, the first voltage is continuously applied to the part of the signal line loop facing the first switching means, irrespective of the switching state of the first switching means. Either this part of the signal line loop is charged with the first voltage with the aid of the switching means or it is connected to the first voltage connection via the first impedance. As this part of the signal line loop is in a highly resistive state, the first voltage applies in both cases. The situation is analogous for the part of the signal line loop facing the second switching means. The second voltage is continuously applied to it, irrespective of the switching state of the second switching means.

Further features and advantages of the invention emerge from the description in association with the drawings and the claims. An advantageous embodiment of the invention is illustrated in the drawing and is described below.

DETAILED DESCRIPTION

Figure 1:
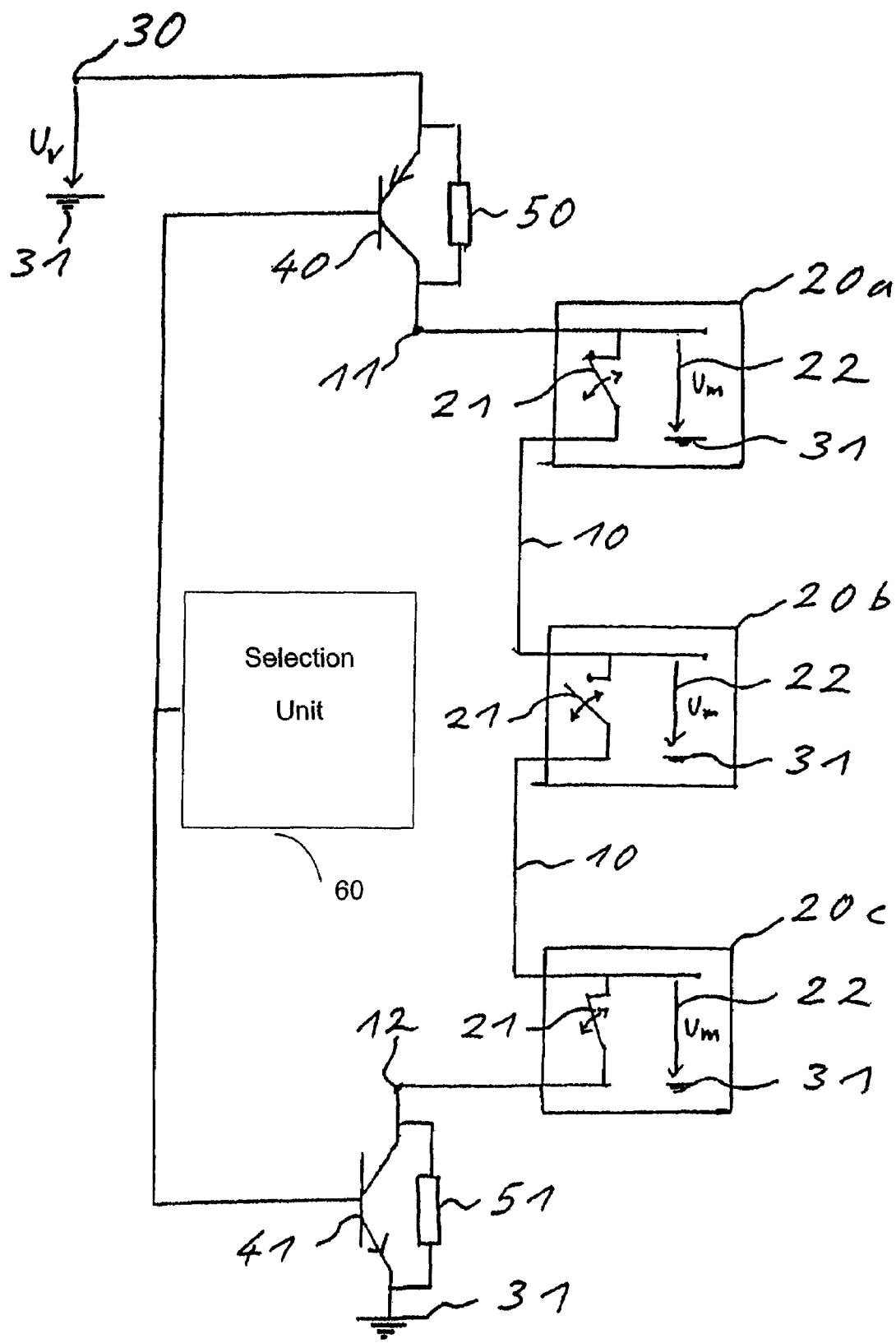
FIG. 1 shows a schematic block diagram of a circuit configuration for identifying error situations in interconnected partial systems for voltage generation in a fuel cell system.
Figure 2:
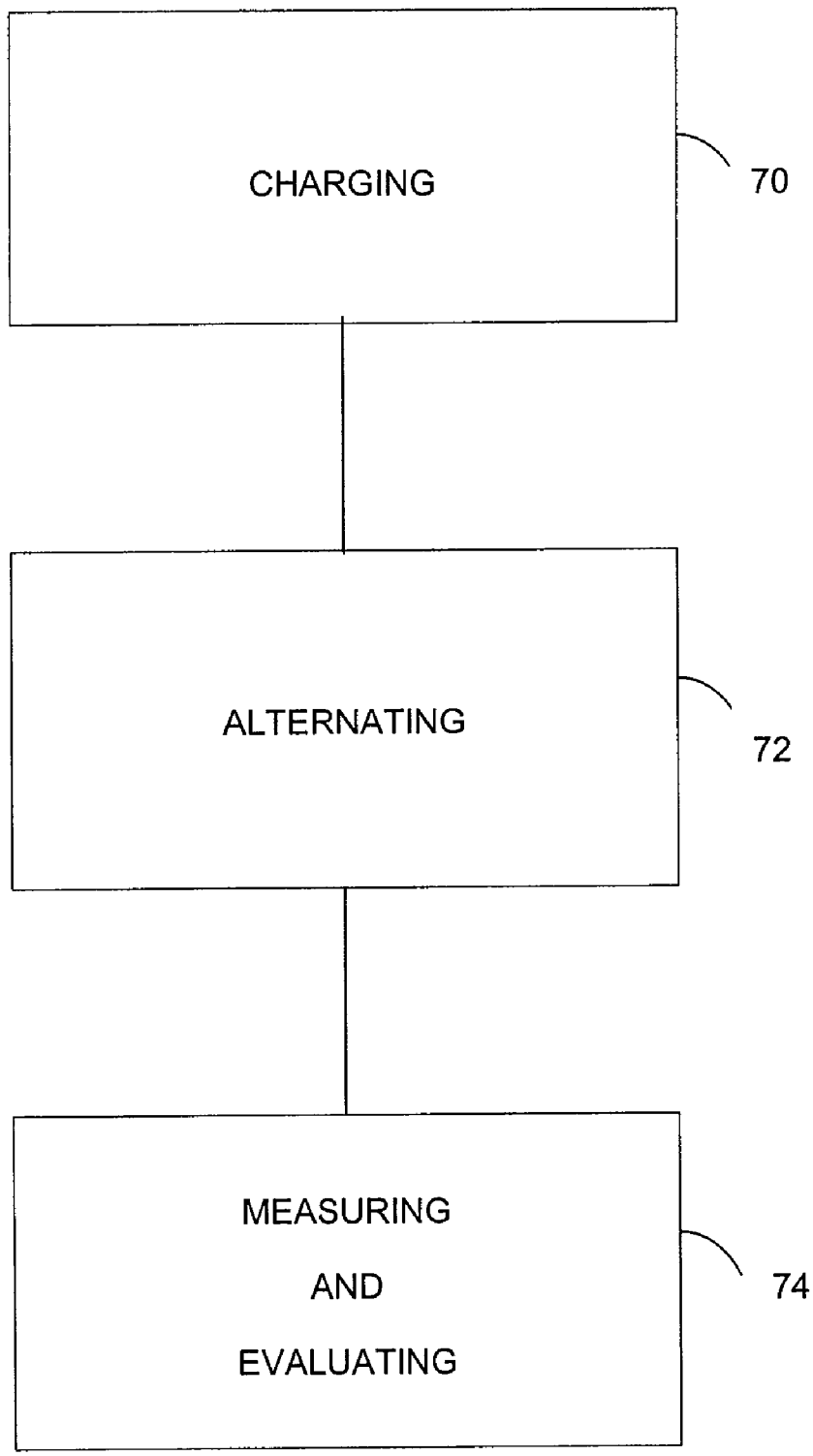
FIG. 2 shows a flow diagram for a method in accordance with an embodiment of the invention.

The circuit configuration of FIG. 1 comprises an electrical signal line loop 10 with a first end 11 and a second end 12, three partial systems 20a, 20b and 20c, connected thereto and serving, for example, to generate high voltages in the fuel cell system, a voltage source with a first voltage connection 30 for providing a first voltage, a first pnp-type transistor 40, a second npn-type transistor 41, complementary to the first transistor 40, a first resistor 50, a second resistor 51 and a selection unit 60. The collector-emitter section of the first transistor 40 is looped in parallel to the resistor 50 between the first end 11 of the signal line loop 10 and the voltage connection 30. The collector-emitter section of the second transistor 41 is looped in parallel to the second resistor 51 between the second end 12 of the signal line loop 10 and a ground contact 31. The selection unit 60 is connected to the respective basic connections of the transistors 40 and 41. The signal line loop 10 is looped through the partial systems 20a, 20b and 20c. Provided in the partial systems 20a, 20b and 20c is in each case a relay 21 for interrupting the signal line loop depending on the functional state of the respective partial system. The partial systems 20a, 20b and 20c are in each case connected with high resistivity to the signal line loop 10 and in each case determine the voltage on the signal line loop with a voltage measuring device 22.

The selection unit 60 selects the transistors 40 and 41 in such a way that alternately either the first transistor 40 is conductive and the second transistor 41 locks or the second transistor 41 is conductive and the first transistor 40 locks. The selection signal of the selection unit 60 is a periodic square-wave signal with a fixed pulse duty factor. If the first transistor 40 is conductive, when there is error-free operation, the current flows away through the first transistor 40 and to a negligible proportion through the first resistor 50, via the signal line loop 10, through the partial systems 20a, 20b and 20c and through the second resistor 51 to earth 31. The partial systems 20a, 20b and 20c measure in each case approximately one voltage level, resulting from the voltage level of the voltage connection 30 minus the for-ward voltage of the first transistor 40.

After a predetermined time the selection unit 60 selects the transistors 40 and 41 in such a way that the first transistor 40 locks and the second transistor 41 becomes conductive. The current now flows away through the first resistor 50, via the signal line loop 10, through the partial systems 20a, 20b, 20c and through the second transistor 41 and to a negligible pro-portion through the resistor 51 to earth 31. The partial systems in this case measure approximately one voltage level resulting from the forward voltage of the transistor 41.

With proper functioning all the partial systems 20a, 20b, 20c on the signal line loop 10 measure one voltage curve which alternates approximately between the voltage level of the voltage connection 30 and the ground potential of the ground connection 31 and in its chronological course corresponds to the selection signal of the selection unit 60. If at least one partial system measures a DC voltage there must be an error present.

Thus, in one embodiment, a method is provided comprising the steps of: charging 70 a first end of the signal line loop with a first voltage of a first voltage connection and connecting a second end of the signal line loop to a second voltage connection via second impedance, alternating 72 with this, connecting the first end to the first voltage connection via a first impedance and charging the second end with the second voltage of the second voltage connection; and measuring and evaluating 74 the signal course on the signal line loop to identify the error situation.

In the event of interruption of the signal line loop 10, for example owing to a malfunction of partial system 20b, and thereby caused opening of its associated relay 21, partial system 20a on the section of the signal line loop 10 connected to the first transistor 40 continuously measures the first voltage. Partial system 20c on the section of the signal line loop 10 connected to the second transistor 40 continuously measures approximately the ground potential of the ground connection 31. An interruption is detected by all the partial systems 20a, 20b and 20c, wherein it is additionally detectable on which side of the interruption point a partial system is located.

In the event of a short-circuit of the signal line loop 10 with the voltage connection 30 or the ground connection 31 all the partial systems 20a, 20b, 20c measure a DC voltage with the voltage level of the voltage connection 30 or the ground potential of the ground connection 31. This is consequently a criterion for the presence of a short-circuit.

We claim:

1. A circuit configuration, comprising
an electrical signal line loop,
several partial systems connected thereto, which evaluate the state of the signal line loop, wherein a first selectable switching means is looped in between a first end of the signal line loop and a first voltage connection and a second selectable switching means is looped in between a second end of the signal line loop and a second voltage connection and wherein a first impedance is switched parallel to the first switching means and a second impedance is switched parallel to the second switching means; and
a selection unit for selecting the first and the second switching means.

2. Circuit configuration according to claim 1, characterised in that the first voltage connection is a supply voltage connection for the partial systems.

3. Circuit configuration according to claim 1, characterised in that the second voltage connection is a ground connection.

4. Circuit configuration according to claim 1, characterised in that the second switching means is a transistor.

5. Circuit configuration according to claim 1, characterised in that the first and the second impedance are ohmic resistors.

6. Circuit configuration according to claim 1, characterised in that the partial systems are connected to the signal line loop with high resistivity.

7. Circuit configuration according to claim 1, characterised in that the signal line loop is looped through the partial systems.

8. Circuit configuration according to claim 1, characterised in that the partial systems have means for interrupting the signal line loop.

9. Circuit configuration according to claim 1, characterised in that the first switching means is a transistor.

10. Circuit configuration according to claim 9, characterised in that the first and the second transistor are transistors complementary to one another.

11. Method for identifying error situations of an electrical signal line loop with several partial systems connected thereto, in particular partial systems for voltage generation in a fuel cell system, characterised by the steps:
charging a first end of the signal line loop with a first voltage of a first voltage connection and connecting a second end of the signal line loop to a second voltage connection via second impedance,
alternating with this, connecting the first end to the first voltage connection via a first impedance and charging the second end with the second voltage of the second voltage connection; and
measuring and evaluating the signal course on the signal line loop to identify the error situation.

12. Method according to claim 11, characterised in that, during evaluation of the signal course is detected which partial systems constantly measure the first voltage, which partial systems measure an undefined voltage and which partial systems constantly measure the second voltage and in that short-circuits or short-circuits to ground and/or interruptions of the signal line loop are ascertained and/or located as a function of the voltages measured by the individual partial systems.

13. Method according to claim 11, characterised in that, during evaluation of the signal course, an error is identified if at least one partial system measures a DC voltage.

14. Method according to claim 11, characterized in that, during evaluation of the signal course, a short-circuit of the signal line loop with the first voltage connection is identified if all the partial systems measure a DC voltage with the level of the first voltage connection.

15. Method according to claim 11, characterised in that, during evaluation of the signal course, a short-circuit of the signal line loop with the second voltage connection is identified if all the partial systems measure a DC voltage with the level of the second voltage connection.

16. Method according to claims claim 11, characterised in that, during evaluation of the signal course, an interruption at a location on the signal line loop is identified if partial systems on one side of the location constantly measure the first voltage and partial systems on the other side of the location constantly measure the second voltage.

* * * * *